US010477335B2

(12) United States Patent
Tammi et al.

(10) Patent No.: US 10,477,335 B2
(45) Date of Patent: *Nov. 12, 2019

(54) CONVERTING MULTI-MICROPHONE CAPTURED SIGNALS TO SHIFTED SIGNALS USEFUL FOR BINAURAL SIGNAL PROCESSING AND USE THEREOF

(71) Applicant: Nokia Technologies Oy, Espoo (FI)

(72) Inventors: Mikko T Tammi, Tampere (FI); Miikka T Vilermo, Siuro (FI)

(73) Assignee: Nokia Technologies Oy, Espoo (FI)

( * ) Notice: Subject to any disclaimer, the term of this patent is extended or adjusted under 35 U.S.C. 154(b) by 329 days.

This patent is subject to a terminal disclaimer.

(21) Appl. No.: 14/851,266

(22) Filed: Sep. 11, 2015

(65) Prior Publication Data

US 2016/0007131 A1 Jan. 7, 2016

Related U.S. Application Data

(63) Continuation of application No. 12/927,663, filed on Nov. 19, 2010, now Pat. No. 9,456,289.

(51) Int. Cl.
*H03G 5/16* (2006.01)
*H03G 3/30* (2006.01)
(Continued)

(52) U.S. Cl.
CPC ............ *H04S 1/002* (2013.01); *G10L 19/008* (2013.01); *H04R 2430/23* (2013.01);
(Continued)

(58) Field of Classification Search
CPC .. H04R 3/005; H04R 1/406; H04R 2201/401; H04R 2430/23; H04S 2400/15;
(Continued)

(56) References Cited

U.S. PATENT DOCUMENTS 5,661,808 A 8/1997 Klayman .......................... 381/1
7,706,543 B2 4/2010 Daniel
(Continued)

FOREIGN PATENT DOCUMENTS

EP 2 154 910 A1 2/2009
JP 21006-180039 7/2006
(Continued)

OTHER PUBLICATIONS

Brebaart, J. et al.; "Multi-Channel Goes Mobile: MPEG Surround Binaural Rendering"; AES International Conference, Audio for Mobile and Handheld Devices; Sep. 2, 2006; pp. 1-13.
(Continued)

*Primary Examiner* — Vivian C Chin
*Assistant Examiner* — Douglas J Suthers
(74) *Attorney, Agent, or Firm* — Harrington & Smith

(57) ABSTRACT

A method includes, estimating directional information based on multiple input channel signals representing at least one arriving sound from a sound source captured by respective multiple microphones that have respective known locations relative to each other, wherein said estimating comprises finding a time delay that removes a time difference between said first and second input channel signals; deriving a mid-signal and a side signal on a basis of a first input channel signal, a second input channel signal and said estimated directional information; and generating an output signal comprising a plurality of output channels using said mid-signal, said side signal and said estimated directional information such that the output signal retains a spatial representation of the captured at least one arriving sound. Apparatus and program products are also disclosed.

17 Claims, 7 Drawing Sheets

(51) Int. Cl.
*H04R 3/04* (2006.01)
*H04S 1/00* (2006.01)
*G10L 19/008* (2013.01)

(52) U.S. Cl.
CPC ....... *H04S 2400/01* (2013.01); *H04S 2400/15* (2013.01); *H04S 2420/07* (2013.01)

(58) Field of Classification Search
CPC .. H04S 1/002; H04S 2420/07; H04S 2400/01; G10L 19/008
USPC .... 381/92, 26, 94.1, 94.2, 94.3, 122, 20, 22, 381/23
See application file for complete search history.

(56) References Cited

U.S. PATENT DOCUMENTS

| | | | | |
|---|---|---|---|---|
| 8,023,660 | B2 | 9/2011 | Faller | 381/23 |
| 8,280,077 | B2 | 10/2012 | Avendano et al. | |
| 8,335,321 | B2 | 12/2012 | Daishin et al. | |
| RE44,611 | E | 11/2013 | Metcalf | |
| 8,600,530 | B2 | 12/2013 | Nagle et al. | |
| 2003/0161479 | A1 | 8/2003 | Yang et al. | |
| 2005/0008170 | A1 | 1/2005 | Pfaffinger | |
| 2005/0195990 | A1* | 9/2005 | Kondo | G10L 21/0272 381/92 |
| 2005/0244023 | A1 | 11/2005 | Roeck et al. | |
| 2008/0013751 | A1 | 1/2008 | Hiselius | |
| 2008/0232601 | A1 | 9/2008 | Pulkki | |
| 2009/0012779 | A1 | 1/2009 | Ikeda et al. | |
| 2009/0022328 | A1 | 1/2009 | Neugebauer et al. | |
| 2010/0061558 | A1 | 3/2010 | Faller | |
| 2010/0150364 | A1 | 6/2010 | Buck et al. | |
| 2010/0166191 | A1 | 7/2010 | Herre et al. | |
| 2010/0215199 | A1* | 8/2010 | Breebaart | H04S 5/005 381/310 |
| 2010/0284551 | A1 | 11/2010 | Oh et al. | |
| 2010/0290629 | A1* | 11/2010 | Morii | G10L 19/008 381/2 |
| 2011/0038485 | A1 | 2/2011 | Neoran | |
| 2011/0081024 | A1 | 4/2011 | Soulodre | |
| 2011/0299702 | A1 | 12/2011 | Faller | |
| 2012/0013768 | A1 | 1/2012 | Zurek et al. | |
| 2012/0019689 | A1 | 1/2012 | Zurek et al. | 348/240.99 |

FOREIGN PATENT DOCUMENTS

| | | | |
|---|---|---|---|
| JP | 2009271183 | A | 11/2009 |
| WO | WO-2007/011157 | A1 | 1/2007 |
| WO | WO-2007011157 | A1 | 1/2007 |
| WO | WO-2008/046531 | A1 | 4/2008 |
| WO | WO-2009/150288 | A1 | 12/2009 |
| WO | WO-2010/017833 | A1 | 2/2010 |
| WO | WO-2010017833 | A1 | 2/2010 |
| WO | WO-2010/028784 | A1 | 3/2010 |
| WO | WO-2010/125228 | A1 | 11/2010 |

OTHER PUBLICATIONS

Lindblom, Jonas et al., "Flexible Sum-Difference Stereo Coding Based on Time-Aligned Singal Components", IEEE, Oct. 2005, pp. 255-258.

Pulkki, V., et al., "Directional audio coding-perception-based reproduction of spatial sound", IWPASH, Nov. 2009, 4 pgs.

Tamai, Yuki et al., "Real-Time 2 Dimensional Sound Source Localization by 128-Channel Hugh Microphone Array", IEEE, 2004, pp. 65-70.

Nakadai, Kazuhiro, et al., "Sound Source Tracking with Directivity Pattern Estimation Using a 64 ch Microphone Array", 7 pgs.

Baumgarte, Frank, et al., "Binaural Cue Coding—Part I: Psychoacoustic Fundamentals and Design Principles", IEEE 2003, pp. 509-519.

Laitinen, Mikko-Ville, et al., "Binaural Reproduction For Directional Audio Coding", IEEE, Oct. 2009, pp. 337-340.

Kallinger, Markus, et al., "Enhanced Direction Estimation Using Microphone Arrays For Directional Audio Coding", IEEE, 2008, pp. 45-48.

Gallo, Emmanuel, et al., "Extracting and Re-rendering Structured Auditory Scenes from Field Recordings", AES 30th International Conference, Mar. 2007, 11 pgs.

Gerzon, Michael A., "Ambisonics In Multichannel Broadcasting And Video", AES, Oct. 1983, 31 pgs.

Pulkki, Ville, "Spatial Sound Reproduction with Directional Audio Coding", J. Audio Eng. Soc., vol. 55 No. 6, Jun. 2007, pp. 503-516.

Faller, Christof, et al., "Binaural Cue Coding—Part II: Schemes and Applications", IEEE, Nov. 2003, pp. 520-531.

Merimaa, Julia, "Applications of a 3-D Microphone Array", AES 112th Convention, Convention Paper 5501, May 2002, 11 pgs.

Backman, Juha, "Microphone array beam forming for multichannel recording", AES 114th Convention, Convention Paper 5721, Mar. 2003, 7 pgs.

Meyer, Jens, et al., "Spherical microphone array for spatial sound recording", AES 115th Convention, Convention Paper 5975, Oct. 2003, 9 pgs.

Ahonen, Jukka, et al., "Directional analysis of sound field with linear microphone array and applications in sound reproduction", AES 124th Convention, Convention Paper 7329, May 2008, 11 pgs.

Wiggins, Bruce, "An Investigation Into The Real-Time Manipulation And Control Of Three-Dimensional Sound Fields", University of Derby, 2004, 348 pgs.

Knapp, "The Generalized Correlation Method for Estimation of Time Delay", (Aug. 1976), (pp. 320-327).

Peter G. Craven, "Continuous Surround Panning for 5-Speaker Reproduction", Continuous Surround Panning, AES 24th International Conferences on Multichannel Audio, Jun. 2003.

A.K. Tellakula; "Acoustic Source Localization Using Time Delay Estimation"; Aug. 2007; whole document (76 pages); Supercomputer Education and Research Centre—Indian Institute of Science, Bangalore, India.

A.D. Blumlein, U.K. patent 394,325,1931. Reprinted in Stereophonic Techniques (Audio Engineering Society, New York, 1986).

V. Pulkki, "Virtual Sound Source Positioning Using Vector Base Amplitude Panning," J. Audio Eng. Soc., vol. 45, pp. 456-466 (Jun. 1997).

Tammi et al., *Apparatus and Method for Multi-Channel Signal Playback*, U.S. Appl. No. 13/209,738, filed Aug. 15, 2011.

Aarts, Ronald M. and Irwan, Roy, "A Method to Convert Stereo to Multi-Channel Sound", Audio Engineering Society Conference Paper, Presented at the 19th International Conference Jun. 21-24, 2001; Schloss Elmau, Germany.

Goodwin, Michael M. and Jot, Jean-Marc, "Binaural 3-D Audio Rendering based on Spatial Audio Scene Coding", Audio Engineering Society Convention paper 7277, Presented at the 123rd Convention, Oct. 5-8, 2007, New York, NY.

* cited by examiner

CONVERTING MULTI-MICROPHONE CAPTURED SIGNALS TO SHIFTED SIGNALS USEFUL FOR BINAURAL SIGNAL PROCESSING AND USE THEREOF

CROSS REFERENCE TO RELATED APPLICATIONS

This is a Continuation application of U.S. patent application Ser. No. 12/927,663, filed on Nov. 19, 2010, the disclosure of which is incorporated herewith in its entirety.

TECHNICAL FIELD

This invention relates generally to microphone recording and signal playback based thereon and, more specifically, relates to processing multi-microphone captured signals and playback of the processed signals.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

Multiple microphones can be used to capture efficiently audio events. However, often it is difficult to convert the captured signals into a form such that the listener can experience the event as if being present in the situation in which the signal was recorded. Particularly, the spatial representation tends to be lacking, i.e., the listener does not sense the directions of the sound sources, as well as the ambience around the listener, identically as if he or she was in the original event.

Binaural recordings, recorded typically with an artificial head with microphones in the ears, are an efficient method for capturing audio events. By using stereo headphones the listener can (almost) authentically experience the original event upon playback of binaural recordings. Unfortunately, in many situations it is not possible to use the artificial head for recordings. However, multiple separate microphones can be used to provide a reasonable facsimile of true binaural recordings.

Even with the use of multiple separate microphones, a problem is converting the capture of multiple (e.g., omnidirectional) microphones in known locations binaural signals, i.e., providing equal or near-equal quality as if the signals were recorded with an artificial head.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein.

SUMMARY

Figure 1:
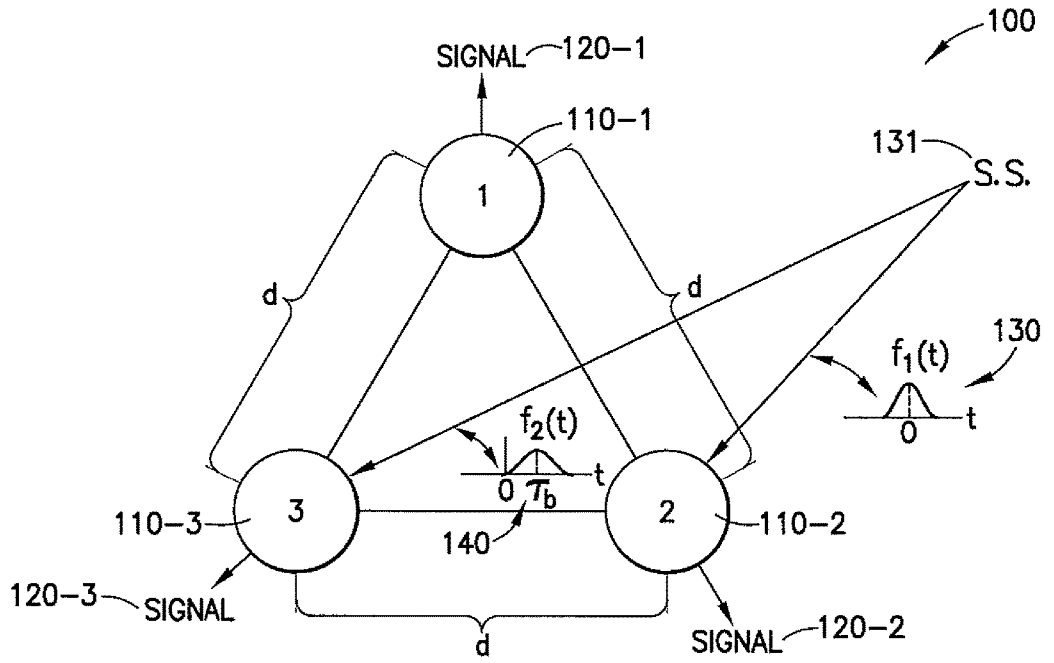
FIG. 1 shows an exemplary microphone setup using omnidirectional microphones.

In an exemplary embodiment, a method includes, estimating directional information based on multiple input channel signals representing at least one arriving sound from a sound source captured by respective multiple microphones that have respective known locations relative to each other, wherein said estimating comprises finding a time delay that removes a time difference between said first and second input channel signals; deriving a mid-signal and a side signal on a basis of a first input channel signal, a second input channel signal and said estimated directional information; and generating an output signal comprising a plurality of output channels using said mid-signal, said side signal and said estimated directional information such that the output signal retains a spatial representation of the captured at least one arriving sound.

In another exemplary embodiment, a method is disclosed that includes, for each of a number of subbands of a frequency range and for at least first and second frequency-domain signals that are frequency-domain representations of corresponding first and second audio signals: determining a time delay of the first frequency-domain signal that removes a time difference between the first and second frequency-domain signals in the subband. The method includes forming a first resultant signal including, for each of the number of subbands, a sum of one of the first or second frequency-domain signals shifted by the time delay and of the other of the first or second frequency-domain signals; and forming a second resultant signal including, for each of the number of subbands, a difference between the shifted one of the first or second frequency-domain signals and the other of the first or second frequency-domain signals.

In an additional exemplary embodiment, the first and second audio signals are signals from first and second of three or more microphones spaced apart by predetermined distances.

In a further exemplary embodiment, the three or more microphones are arranged in a predetermined geometric configuration. The method further comprises for each of the plurality of subbands, determining, using at least the first and second frequency-domain signals that correspond to the first and second microphones and information about the predetermined geometric configuration, a direction of a sound source relative to the three or more microphones.

Determining the direction may further comprise, for each of the plurality of subbands: determining an angle of arriving sound relative to the first and second microphones, the angle having two possible values; delaying the sum for the subband by two different delays dependent on the two possible values to create two shifted sum frequency-domain signals; using a frequency-domain signal corresponding to a third microphone, determining which of the two shifted sum frequency-domain signals has a best correlation with the frequency-domain signal corresponding to the third microphone; and using the best correlation, selecting one of the two possible values of the angle as the direction.

Additionally, the method may include for each of the plurality of subbands: for subbands below a predetermined frequency, applying left and right head related transfer functions to the sum of the first resultant signal to determine left and right mid signals, the left and right head related transfer functions dependent upon the direction; for subbands above the predetermined frequency, applying magnitudes of the left and right head related transfer functions and a fixed delay corresponding to the head related transfer functions to sum of the first resultant signal to determine the left and right mid signals; and applying the fixed delay to the differences of the second resultant signal to determine a delayed side signal.

The method may also include, for each of the plurality of subbands, using the left and right mid signals to determine a scaling factor and applying the scaling factor to the left and right mid signals to determine scaled left and right mid signals; creating left and right output channel signals by adding scaled left and right mid signals for all of the subbands to the delayed side signal for all of the subbands; and outputting the left and right output channel signals.

In another exemplary embodiment, an apparatus includes one or more processors; and one or more memories including computer program code, the one or more memories and the computer program code configured to, with the one or more processors, cause the apparatus to perform at least the following: for each of a number of subbands of a frequency range and for at least first and second frequency-domain signals that are frequency-domain representations of corresponding first and second audio signals: determining a time delay of the first frequency-domain signal that removes a time difference between the first and second frequency-domain signals in the subband; forming a first resultant signal using, for each of the number of subbands, sums using one of the first or second frequency-domain signals shifted by the time delay and using the other of the first or second frequency-domain signals; and forming a second resultant signal using, for each of the number of subbands, differences using the shifted one of the first or second frequency-domain signals and using the other of the first or second frequency-domain signals.

In a further exemplary embodiment, a method is disclosed that includes accessing a first resultant signal including, for each of a number of subbands of a frequency range, a sum of one of a first or second frequency-domain signal shifted by a time delay and of the other of the first or second frequency-domain signals, wherein the first and second frequency-domain signals are frequency-domain representations of corresponding first and second audio signals from first and second of three or more microphones, and the time delay is a time delay of the first frequency-domain signal that removes a time difference between the first and second frequency-domain signals in a corresponding subband; accessing a second resultant signal including, for each of the number of subbands, a difference between the shifted one of the first or second frequency-domain signals and the other of the first or second frequency-domain signals; accessing information corresponding to, for each of the number of subbands, a direction of a sound source relative to the three or more microphones; determining left and right output channel signals using the first and second resultant signals and the information corresponding to the directions; and outputting the left and right output channel signals.

In yet another embodiment, an apparatus is disclosed that includes one or more processors; and one or more memories including computer program code, the one or more memories and the computer program code configured to, with the one or more processors, cause the apparatus to perform at least the following: accessing a first resultant signal including, for each of a number of subbands of a frequency range, a sum of one of a first or second frequency-domain signal shifted by a time delay and of the other of the first or second frequency-domain signals, wherein the first and second frequency-domain signals are frequency-domain representations of corresponding first and second audio signals from first and second of three or more microphones, and the time delay is a time delay of the first frequency-domain signal that removes a time difference between the first and second frequency-domain signals in a corresponding subband; accessing a second resultant signal including, for each of the number of subbands, a difference between the shifted one of the first or second frequency-domain signals and the other of the first or second frequency-domain signals; accessing information corresponding to, for each of the number of subbands, a direction of a sound source relative to the three or more microphones; determining left and right output channel signals using the first and second resultant signals and the information corresponding to the directions; and outputting the left and right output channel signals.

DETAILED DESCRIPTION OF THE DRAWINGS

As stated above, multiple separate microphones can be used to provide a reasonable facsimile of true binaural recordings. In recording studio and similar conditions, the microphones are typically of high quality and placed at particular predetermined locations. However, it is reasonable to apply multiple separate microphones for recording to less controlled situations. For instance, in such situations, the microphones can be located in different positions depending on the application:

1) In the corners of a mobile device such as a mobile phone;

2) In a headband or other similar wearable solution, which is connected to a mobile device;

3) In a separate device, which is connected to a mobile device or computer;

4) In separate mobile devices, in which case actual processing occurs in one of the devices or in a separate server; or 5) With a fixed microphone setup, for example, in a teleconference room, connected to a phone or computer.

Furthermore, there are several possibilities to exploit spatial sound recordings in different applications:

- Binaural audio enables mobile "3D" phone calls, i.e., "feel-what-I-feel" type of applications. This provides the listener a much stronger experience of "being there". This is a desirable feature with family members or friends when one wants to share important moments as make these moments as realistic as possible.
- Binaural audio can be combined with video, and currently with three-dimensional (3D) video recorded, e.g., by a consumer. This provides a more immersive experience to consumers, regardless of whether the audio/video is real-time or recorded.

Teleconferencing applications can be made much more natural with binaural sound. Hearing the speakers in different directions makes it easier to differentiate speakers and it is also possible to concentrate on one speaker even though there would be several simultaneous speakers.

Spatial audio signals can be utilized also in head tracking. For instance, on the recording end, the directional changes in the recording device can be detected (and removed if desired). Alternatively, on the listening end, the movements of the listener's head can be compensated such that the sounds appear, regardless of head movement, to arrive from the same direction.

As stated above, even with the use of multiple separate microphones, a problem is converting the capture of multiple (e.g., omnidirectional) microphones in known locations into good quality signals that retain the original spatial representation. This is especially true for good quality signals that may also be used as binaural signals, i.e., providing equal or near-equal quality as if the signals were recorded with an artificial head. Exemplary embodiments herein provide techniques for converting the capture of multiple (e.g., omnidirectional) microphones in known locations into signals that retain the original spatial representation. Techniques are also provided herein for modifying the signals into binaural signals, to provide equal or near-equal quality as if the signals were recorded with an artificial head.

The following techniques mainly refer to a system 100 with three microphones 110-1, 110-2, and 110-3 on a plane (e.g., horizontal level) in the geometrical shape of a triangle with vertices separated by distance, d, as illustrated in FIG. 1. However, the techniques can be easily generalized to different microphone setups and geometry. Typically, all the microphones are able to capture sound events from all directions, i.e., the microphones are omnidirectional. Each microphone 110 produces a typically analog signal 120.

The value of a 3D surround audio system can be measured using several different criteria. The most import criteria are the following:

1. Recording flexibility. The number of microphones needed, the price of the microphones (omnidirectional microphones are the cheapest), the size of the microphones (omnidirectional microphones are the smallest), and the flexibility in placing the microphones (large microphone arrays where the microphones have to be in a certain position in relation to other microphones are difficult to place on, e.g., a mobile device).

2. Number of channels. The number of channels needed for transmitting the captured signal to a receiver while retaining the ability for head tracking (if head tracking is possible for the given system in general): A high number of channels takes too many bits to transmit the audio signal over networks such as mobile networks.

3. Rendering flexibility. For the best user experience, the same audio signal should be able to be played over various different speaker setups: mono or stereo from the speakers of, e.g., a mobile phone or home stereos; 5.1 channels from a home theater; stereo using headphones, etc. Also, for the best 3D headphone experience, head tracking should be possible.

4. Audio quality. Both pleasantness and accuracy (e.g., the ability to localize sound sources) are important in 3D surround audio. Pleasantness is more important for commercial applications.

With regard to this criteria, exemplary embodiments of the instant invention provide the following:

1. Recording flexibility. Only omnidirectional microphones need be used. Only three microphones are needed. Microphones can be placed in any configuration (although the configuration shown in FIG. 1 is used in the examples below).

2. Number of channels needed. Two channels are used for higher quality. One channel may be used for medium quality.

3. Rendering flexibility. This disclosure describes only binaural rendering, but all other loudspeaker setups are possible, as well as head tracking.

4. Audio quality. In tests, the quality is very close to original binaural recordings and High Quality DirAC (directional audio coding).

In the instant invention, the directional component of sound from several microphones is enhanced by removing time differences in each frequency band of the microphone signals. In this way, a downmix from the microphone signals will be more coherent. A more coherent downmix makes it possible to render the sound with a higher quality in the receiving end (i.e., the playing end).

In an exemplary embodiment, the directional component may be enhanced and an ambience component created by using mid/side decomposition. The mid-signal is a downmix of two channels. It will be more coherent with a stronger directional component when time difference removal is used. The stronger the directional component is in the mid-signal, the weaker the directional component is in the side-signal. This makes the side-signal a better representation of the ambience component.

This description is divided into several parts. In the first part, the estimation of the directional information is briefly described. In the second part, it is described how the directional information is used for generating binaural signals from three microphone capture. Yet additional parts describe apparatus and encoding/decoding.

Directional Analysis

There are many alternative methods regarding how to estimate the direction of arriving sound. In this section, one method is described to determine the directional information. This method has been found to be efficient. This method is merely exemplary and other methods may be used. This method is described using FIGS. 2 and 3. It is noted that the flowcharts for FIGS. 2 and 3 (and all other figures having flowcharts) may be performed by software executed by one or more processors, hardware elements (such as integrated circuits) designed to incorporate and perform one or more of the operations in the flowcharts, or some combination of these.

A straightforward direction analysis method, which is directly based on correlation between channels, is now described. The direction of arriving sound is estimated independently for B frequency domain subbands. The idea is to find the direction of the perceptually dominating sound source for every subband.

Figure 2:
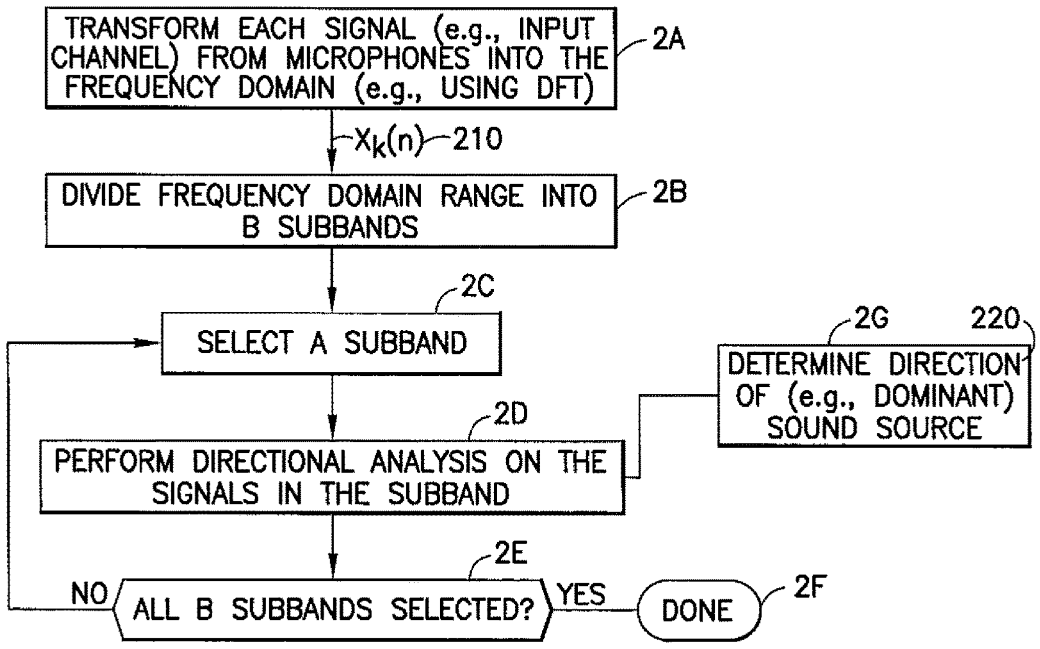
FIG. 2 is a block diagram of a flowchart for performing a directional analysis on microphone signals from multiple microphones.
Figure 3:
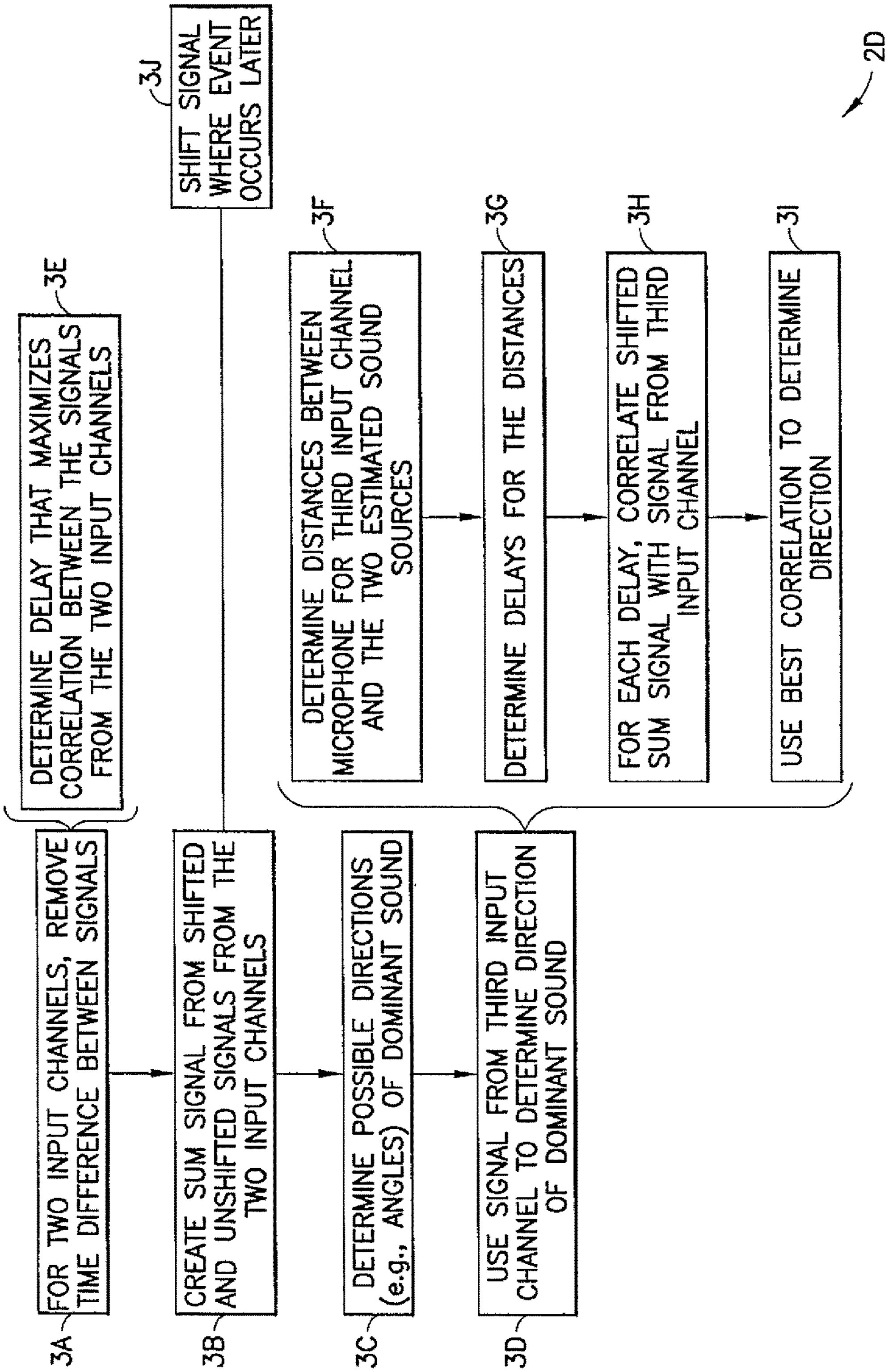
FIG. 3 is a block diagram of a flowchart for performing directional analysis on subbands for frequency-domain microphone signals.

Every input channel k=1, 2, 3 is transformed to the frequency domain using the DFT (discrete Fourier transform) (block 2A of FIG. 2). Each input channel corresponds to a signal 120-1, 120-2, 120-3 produced by a corresponding microphone 110-1, 110-2, 110-3 and is a digital version (e.g., sampled version) of the analog signal 120. In an exemplary embodiment, sinusoidal windows with 50 percent overlap and effective length of 20 ms (milliseconds) are used. Before the DFT transform is used, $D_{tot}=D_{max}+D_{HRTF}$ zeroes are added to the end of the window. $D_{max}$ corresponds to the maximum delay in samples between the microphones. In the microphone setup presented in FIG. 1, the maximum delay is obtained as $$D_{max} = \frac{dF_s}{v}, \tag{1}$$

where $F_s$ is the sampling rate of signal and v is the speed of the sound in the air. $D_{HRTF}$ is the maximum delay caused to the signal by HRTF (head related transfer functions) processing. The motivation for these additional zeroes is given later. After the DFT transform, the frequency domain representation $X_k$ (n) (reference 210 in FIG. 2) results for all three channels, k=1, . . . 3, n=0, . . . , N−1. N is the total length of the window considering the sinusoidal window (length $N_s$) and the additional $D_{tot}$ zeroes.

The frequency domain representation is divided into B subbands (block 2B)

$$X_k^b(n)=X_k(n_b+n), n=0, \ldots, n_{b+1}-n_b-1, b=0, \ldots, B-1, \tag{2}$$

where $n_b$ is the first index of bth subband. The widths of the subbands can follow, for example, the ERB (equivalent rectangular bandwidth) scale.

For every subband, the directional analysis is performed as follows. In block 2C, a subband is selected. In block 2D, directional analysis is performed on the signals in the subband. Such a directional analysis determines a direction 220 ($\alpha_b$ below) of the (e.g., dominant) sound source (block 2G). Block 2D is described in more detail in FIG. 3. In block 2E, it is determined if all subbands have been selected. If not (block 2B=NO), the flowchart continues in block 2C. If so (block 2E=YES), the flowchart ends in block 2F.

More specifically, the directional analysis is performed as follows. First the direction is estimated with two input channels (in the example implementation, input channels 2 and 3). For the two input channels, the time difference between the frequency-domain signals in those channels is removed (block 3A of FIG. 3). The task is to find delay $\tau_b$ that maximizes the correlation between two channels for subband b (block 3E). The frequency domain representation of, e.g., $X_k^b(n)$ can be shifted $\tau_b$ time domain samples using $$X_{k,\tau_b}^b(n) = X_k^b(n)e^{-j\frac{2\pi n\tau_b}{N}}. \tag{3}$$

Now the optimal delay is obtained (block 3E) from $$\max_{\tau_b} Re\left(\sum_{n=0}^{nb+1-nb-1}\left(X_{2,\tau_b}^{b}(n)^* X_3^{b}(n)\right)\right), \tau_b \in [-D_{max}, D_{max}] \tag{4}$$

where Re indicates the real part of the result and * denotes complex conjugate. $X_{,2\tau_b}^{\ b}$ and $X_3^{\ b}$ are considered vectors with length of $n_{b+1}-n_b-1$ samples. Resolution of one sample is generally suitable for the search of the delay. Also other perceptually motivated similarity measures than correlation can be used. With the delay information, a sum signal is created (block 3B). It is constructed using following logic $$X_{sum}^b = \begin{cases} \left(X_{2,\tau_b}^b + X_3^b\right)/2 & \tau_b \le 0 \\ \left(X_2^b + X_{3,-\tau_b}^b\right)/2 & \tau_b > 0 \end{cases}, \tag{5}$$

where $\tau_b$ is the $\tau_b$ determined in Equation (4).

In the sum signal the content (i.e., frequency-domain signal) of the channel in which an event occurs first is added as such, whereas the content (i.e., frequency-domain signal) of the channel in which the event occurs later is shifted to obtain the best match (block 3J).

Turning briefly to FIG. 1, a simple illustration helps to describe in broad, non-limiting terms, the shift $\tau_b$ and its operation above in equation (5). A sound source (S.S.) 131 creates an event described by the exemplary time-domain function $f_1(t)$ 130 received at microphone 2, 110-2. That is, the signal 120-2 would have some resemblance to the time-domain function $f_1(t)$ 130. Similarly, the same event, when received by microphone 3, 110-3 is described by the exemplary time-domain function $f_2(t)$ 140. It can be seen that the microphone 3, 110-3 receives a shifted version of $f_1(t)$ 130. In other words, in an ideal scenario, the function $f_2(t)$ 140 is simply a shifted version of the function $f_1(t)$ 130, where $f_2(t)=f_1(t-\tau_b)$ 130. Thus, in one aspect, the instant invention removes a time difference between when an occurrence of an event occurs at one microphone (e.g., microphone 3, 110-3) relative to when an occurrence of the event occurs at another microphone (e.g., microphone 2, 110-2). This situation is described as ideal because in reality the two microphones will likely experience different environments, their recording of the event could be influenced by constructive or destructive interference or elements that block or enhance sound from the event, etc.

The shift $\tau_b$ indicates how much closer the sound source is to microphone 2, 110-2 than microphone 3, 110-3 (when $\tau_b$ is positive, the sound source is closer to microphone 2 than mircrophone 3). The actual difference in distance can be calculated as $$\Delta_{23} = \frac{v\tau_b}{F_s}. \tag{6}$$

Utilizing basic geometry on the setup in FIG. 1, it can be determined that the angle of the arriving sound is equal to (returning to FIG. 3, this corresponds to block 3C)

$$\dot{\alpha}_b = \pm\cos^{-1}\left(\frac{\Delta_{23}^2 + 2b\Delta_{23} - d^2}{2db}\right), \tag{7}$$

where d is the distance between microphones and b is the estimated distance between sound sources and nearest microphone. Typically b can be set to a fixed value. For example b=2 meters has been found to provide stable results. Notice that there are two alternatives for the direction of the arriving sound as the exact direction cannot be determined with only two microphones.

The third microphone is utilized to define which of the signs in equation (7) is correct (block 3D). An example of a technique for performing block 3D is as described in reference to blocks 3F to 3I. The distances between microphone 1 and the two estimated sound sources are the following (block 3F):

$$\delta_b^+=\sqrt{(h+b\sin(\dot{\alpha}_b))^2+(d/2+b\cos(\dot{\alpha}_b))^2}$$

$$\delta_b^-=\sqrt{(h-b\sin(\dot{\alpha}_b))^2+(d/2+b\cos(\dot{\alpha}_b))^2}, \tag{8}$$

where h is the height of the equilateral triangle, i.e.

$$h = \frac{\sqrt{3}}{2}d. \tag{9}$$

The distances in equation (8) equal to delays (in samples) (block 3G)

$$\tau_b^+ = \frac{\delta^+ - b}{v} F_s \qquad (10)$$
$$\tau_b^- = \frac{\delta^- - b}{v} F_s.$$

Out of these two delays, the one is selected that provides better correlation with the sum signal. The correlations are obtained as (block 3H)

$$c_b^+ = Re(\Sigma_{n=0}^{nb+1-nb-1}(X_{sum,\tau_b}{}^b + (n)^* X_1^b(n)))$$

$$c_b^- = Re(\Sigma_{n=0}^{nb+1-nb-1}(X_{sum,\tau_b}{}^b - (n)^* X_1^b(n))). \qquad (11)$$

Now the direction is obtained of the dominant sound source for subband b (block 3I):

$$\alpha_b = \begin{cases} \dot{\alpha}_b & c_b^+ \geq c_b^- \\ -\dot{\alpha}_b & c_b^+ < c_b^- \end{cases}. \qquad (12)$$

The same estimation is repeated for every subband (e.g., as described above in reference to FIG. 2).

Binaural Synthesis

Figure 4:
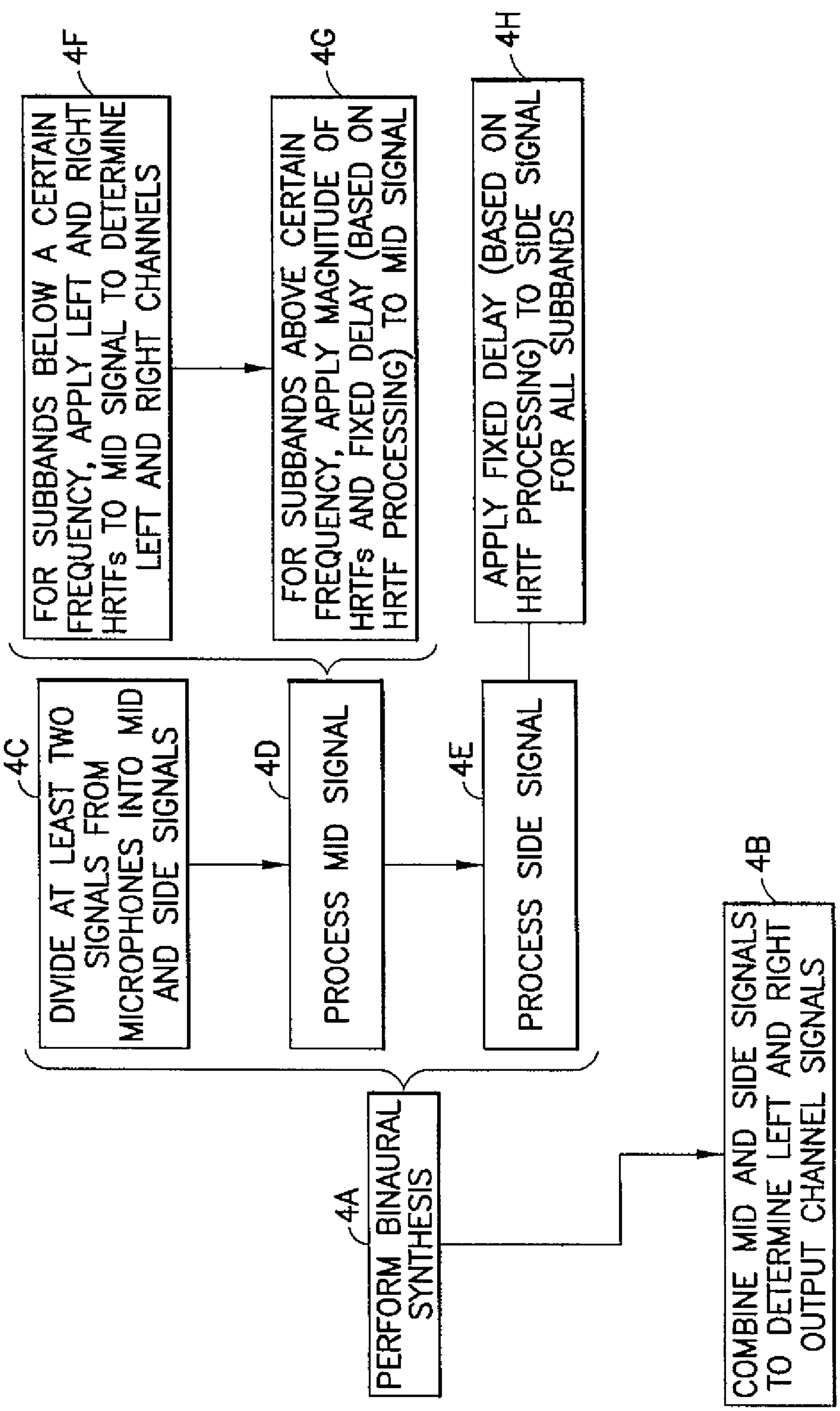
FIG. 4 is a block diagram of a flowchart for performing binaural synthesis and creating output channel signals therefrom.
Figure 5:
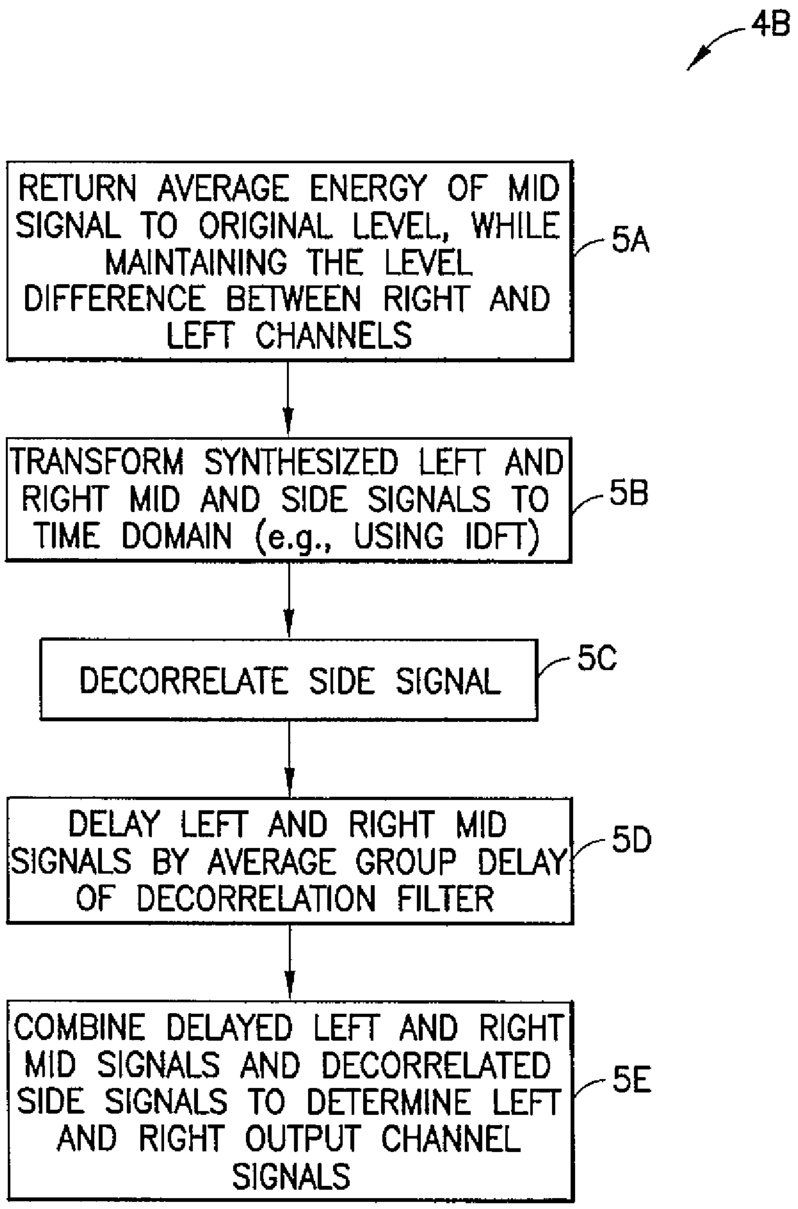
FIG. 5 is a block diagram of a flowchart for combining mid and side signals to determine left and right output channel signals.

With regard to the following binaural synthesis, reference is made to FIGS. 4 and 5. Exemplary binaural synthesis is described relative to block 4A. After the directional analysis, we now have estimates for the dominant sound source for every subband b. However, the dominant sound source is typically not the only source, and also the ambience should be considered. For that purpose, the signal is divided into two parts (block 4C): the mid and side signals. The main content in the mid signal is the dominant sound source which was found in the directional analysis. Respectively, the side signal mainly contains the other parts of the signal. In an exemplary proposed approach, mid and side signals are obtained for subband b as follows:

$$M^b = \begin{cases} (X_{2,\tau_b}^b + X_3^b)/2 & \tau_b \leq 0 \\ (X_2^b + X_{3,-\tau_b}^b)/2 & \tau_b > 0 \end{cases}, \qquad (13)$$

$$S^b = \begin{cases} (X_{2,\tau_b}^b - X_3^b)/2 & \tau_b \leq 0 \\ (X_2^b - X_{3,-\tau_b}^b)/2 & \tau_b > 0 \end{cases}. \qquad (14)$$

Notice that the mid signal $M^b$ is actually the same sum signal which was already obtained in equation (5) and includes a sum of a shifted signal and a non-shifted signal. The side signal $S^b$ includes a difference between a shifted signal and a non-shifted signal. The mid and side signals are constructed in a perceptually safe manner such that, in an exemplary embodiment, the signal in which an event occurs first is not shifted in the delay alignment (see, e.g., block 3J, described above). This approach is suitable as long as the microphones are relatively close to each other. If the distance between microphones is significant in relation to the distance to the sound source, a different solution is needed. For example, it can be selected that channel 2 is always modified to provide best match with channel 3.

Mid Signal Processing

Mid signal processing is performed in block 4D. An example of block 4D is described in reference to blocks 4F and 4G. Head related transfer functions (IIRTF) are used to synthesize a binaural signal. For HRTF, see, e.g., B. Wiggins, "An Investigation into the Real-time Manipulation and Control of Three Dimensional Sound Fields", PhD thesis, University of Derby, Derby, UK, 2004. Since the analyzed directional information applies only to the mid component, only that is used in the HRTF filtering. For reduced complexity, filtering is performed in frequency domain. The time domain impulse responses for both ears and different angles, $h_{L,\alpha}(t)$ and $h_{R,\alpha}(t)$, are transformed to corresponding frequency domain representations $H_{L,\alpha}(n)$ and $H_{R,\alpha}(n)$ using DFT. Required numbers of zeroes are added to the end of the impulse responses to match the length of the transform window (N). HRTFs are typically provided only for one ear, and the other set of filters are obtained as mirror of the first set.

HRTF filtering introduces a delay to the input signal, and the delay varies as a function of direction of the arriving sound. Perceptually the delay is most important at low frequencies, typically for frequencies below 1.5 kHz. At higher frequencies, modifying the delay as a function of the desired sound direction does not bring any advantage, instead there is a risk of perceptual artifacts. Therefore different processing is used for frequencies below 1.5 kHz and for higher frequencies.

For low frequencies, the HRTF filtered set is obtained for one subband as a product of individual frequency components (block 4F):

$$\tilde{M}_L{}^b(n) = M^b(n) H_{L,\alpha_b}(n_b + n), n = 0, \ldots, n_{b+1} - n_b - 1,$$

$$\tilde{M}_R{}^b(n) = M^b(n) H_{R,\alpha_b}(n_b + n), n = 0, \ldots, n_{b+1} - n_b - 1. \qquad (15)$$

The usage of HRTFs is straightforward. For direction (angle) β, there are HRTF filters for left and right ears, $HL_\beta(z)$ and $HR_\beta(z)$, respectively. A binaural signal with sound source S(z) in direction β is generated straightforwardly as $L(z)=HL_\beta(z)S(z)$ and $R(z)=HR_\beta(z)S(z)$, where L(z) and R(z) are the input signals for left and right ears. The same filtering can be performed in DFT domain as presented in equation (15). For the subbands at higher frequencies the processing goes as follows (block 4G):

$$\tilde{M}_L^b(n) = M^b(n)|H_{L,\alpha_b}(n_b + n)|e^{-j\frac{2\pi(n+n_b)\tau_{HRTF}}{N}}, \qquad (16)$$
$$n = 0, \ldots, n_{b+1} - n_b - 1,$$
$$\tilde{M}_R^b(n) = M^b(n)|H_{R,\alpha_b}(n_b + n)|e^{-j\frac{2\pi(n+n_b)\tau_{HRTF}}{N}},$$
$$n = 0, \ldots, n_{b+1} - n_b - 1$$

It can be seen that only the magnitude part of the HRTF filters are used, i.e., the delays are not modified. On the other hand, a fixed delay of $\tau_{HRTF}$ samples is added to the signal. This is used because the processing of the low frequencies (equation (15)) introduces a delay to the signal. To avoid a mismatch between low and high frequencies, this delay needs to be compensated. $\tau_{HRTF}$ is the average delay introduced by HRTF filtering and it has been found that delaying all the high frequencies with this average delay provides good results. The value of the average delay is dependent on the distance between sound sources and microphones in the used HRTF set.

Side Signal Processing

Processing of the side signal occurs in block 4E. An example of such processing is shown in block 4H. The side signal does not have any directional information, and thus no HRTF processing is needed. However, delay caused by the HRTF filtering has to be compensated also for the side signal. This is done similarly as for the high frequencies of the mid signal (block 4H):

$$\overline{S}^b(n) = S^b(n)e^{-j\frac{2\pi(n+n_b)\tau_{HRTF}}{N}}, n = 0, \ldots, n_{b+1} - n_b - 1. \quad (17)$$

For the side signal, the processing is equal for low and high frequencies.

Combining Mid and Side Signals

In block 4B, the mid and side signals are combined to determine left and right output channel signals. Exemplary techniques for this are shown in FIG. 5, blocks 5A-5E. The mid signal has been processed with HRTFs for directional information, and the side signal has been shifted to maintain the synchronization with the mid signal. However, before combining mid and side signals, there still is a property of the HRTF filtering which should be considered: HRTF filtering typically amplifies or attenuates certain frequency regions in the signal. In many cases, also the whole signal is attenuated. Therefore, the amplitudes of the mid and side signals may not correspond to each other. To fix this, the average energy of mid signal is returned to the original level, while still maintaining the level difference between left and right channels (block 5A). In one approach, this is performed separately for every subband.

The scaling factor for subband b is obtained as $$\varepsilon^b = \sqrt{\frac{2\left(\sum_{n=n_b}^{n_{b+1}-1} |M^b(n)|^2\right)}{\sum_{n=n_b}^{n_{b+1}-1} \left|\tilde{M}_L^b(n)\right|^2 + \sum_{n=n_b}^{n_{b+1}-1} \left|\tilde{M}_R^b(n)\right|^2}}. \quad (18)$$

Now the scaled mid signal is obtained as:

$$\overline{M}_L{}^n = \varepsilon^b \tilde{M}_L{}^b,$$

$$\overline{M}_R{}^n = \varepsilon^b \tilde{M}_R{}^b. \quad (19)$$

Synthesized mid and side signals $\overline{M}_L$, $\overline{M}_R$ and $\overline{S}$ are transformed to the time domain using the inverse DFT (IDFT) (block 5B). In an exemplary embodiment, $D_{tot}$ last samples of the frames are removed and sinusoidal windowing is applied. The new frame is combined with the previous one with, in an exemplary embodiment, 50 percent overlap, resulting in the overlapping part of the synthesized signals $m_L(t)$, $m_R(t)$ and s(t).

The externalization of the output signal can be further enhanced by the means of decorrelation. In an embodiment, decorrelation is applied only to the side signal (block 5C), which represents the ambience part. Many kinds of decorrelation methods can be used, but described here is a method applying an all-pass type of decorrelation filter to the synthesized binaural signals. The applied filter is of the form $$D_L(z) = \frac{\beta + z^{-P}}{1 + \beta z^{-P}}, \quad (20)$$

$$D_R(z) = \frac{-\beta + z^{-P}}{1 - \beta z^{-P}}.$$

where P is set to a fixed value, for example 50 samples for a 32 kHz signal. The parameter β is used such that the parameter is assigned opposite values for the two channels. For example 0.4 is a suitable value for β. Notice that there is a different decorrelation filter for each of the left and right channels.

The output left and right channels are now obtained as (block 5E):

$$L(z) = z^{-P_D} M_L(z) + D_L(z)S(z)$$

$$R(z) = z^{-P_D} M_R(z) + D_R(z)S(z)$$

where $P_D$ is the average group delay of the decorrelation filter (equation (20)) (block 5D), and $M_L$(z), $M_R$(z) and S(z) are z-domain representations of the corresponding time domains signals.

Exemplary System

Figure 6:
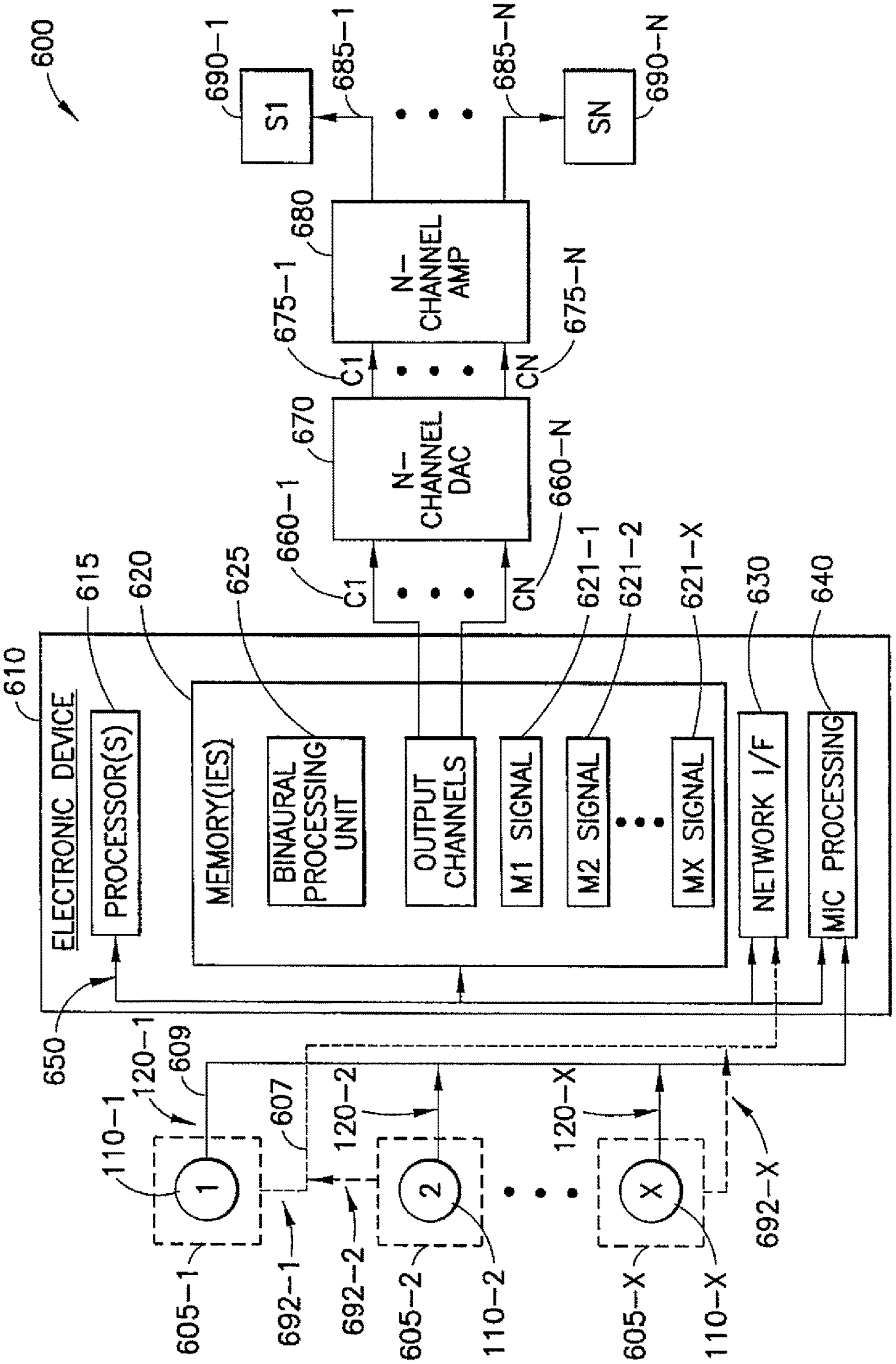
FIG. 6 is a block diagram of a system suitable for performing embodiments of the invention.

Turning to FIG. 6, a block diagram is shown of a system 600 suitable for performing embodiments of the invention. System 600 includes X microphones 110-1 through 110-X that are capable of being coupled to an electronic device 610 via wired connections 609. The electronic device 610 includes one or more processors 615, one or more memories 620, one or more network interfaces 630, and a microphone processing module 640, all interconnected through one or more buses 650. The one or more memories 620 include a binaural processing unit 625, output channels 660-1 through 660-N, and frequency-domain microphone signals M1 621-1 through MX 621-X. In the exemplary embodiment of FIG. 6, the binaural processing unit 625 contains computer program code that, when executed by the processors 615, causes the electronic device 610 to carry out one or more of the operations described herein. In another exemplary embodiment, the binaural processing unit or a portion thereof is implemented in hardware (e.g., a semiconductor circuit) that is defined to perform one or more of the operations described above.

In this example, the microphone processing module 640 takes analog microphone signals 120-1 through 120-X, converts them to equivalent digital microphone signals (not shown), and converts the digital microphone signals to frequency-domain microphone signals MI 621-1 through MX 621-X.

The electronic device 610 can include, but are not limited to, cellular telephones, personal digital assistants (PDAs), computers, image capture devices such as digital cameras, gaming devices, music storage and playback appliances, Internet appliances permitting Internet access and browsing, as well as portable or stationary units or terminals that incorporate combinations of such functions.

In an example, the binaural processing unit acts on the frequency-domain microphone signals 621-1 through 621-X and performs the operations in the block diagrams shown in FIGS. 2-5 to produce the output channels 660-1 through 660-N. Although right and left output channels are described in FIGS. 2-5, the rendering can be extended to higher numbers of channels, such as 5, 7, 9, or 11.

For illustrative purposes, the electronic device 610 is shown coupled to an N-channel DAC (digital to audio converter) 670 and an n-channel amp (amplifier) 680, although these may also be integral to the electronic device 610. The N-channel DAC 670 converts the digital output channel signals 660 to analog output channel signals 675, which are then amplified by the N-channel amp 680 for playback on N speakers 690 via N amplified analog output channel signals 685. The speakers 690 may also be integrated into the electronic device 610. Each speaker 690 may include one or more drivers (not shown) for sound reproduction.

The microphones 110 may be omnidirectional microphones connected via wired connections 609 to the microphone processing module 640. In another example, each of the electronic devices 605-1 through 605-X has an associated microphone 110 and digitizes a microphone signal 120 to create a digital microphone signal (e.g., 692-1 through 692-X) that is communicated to the electronic device 610 via a wired or wireless network 609 to the network interface 630. In this case, the binaural processing unit 625 (or some other device in electronic device 610) would convert the digital microphone signal 692 to a corresponding frequency-domain signal 621. As yet another example, each of the electronic devices 605-1 through 605-X has an associated microphone 110, digitizes a microphone signal 120 to create a digital microphone signal 692, and converts the digital microphone signal 692 to a corresponding frequency-domain signal 621 that is communicated to the electronic device 610 via a wired or wireless network 609 to the network interface 630.

Signal Coding

Proposed techniques can be combined with signal coding solutions. Two channels (mid and side) as well as directional information need to be coded and submitted to a decoder to be able to synthesize the signal. The directional information can be coded with a few kilobits per second.

Figure 7:
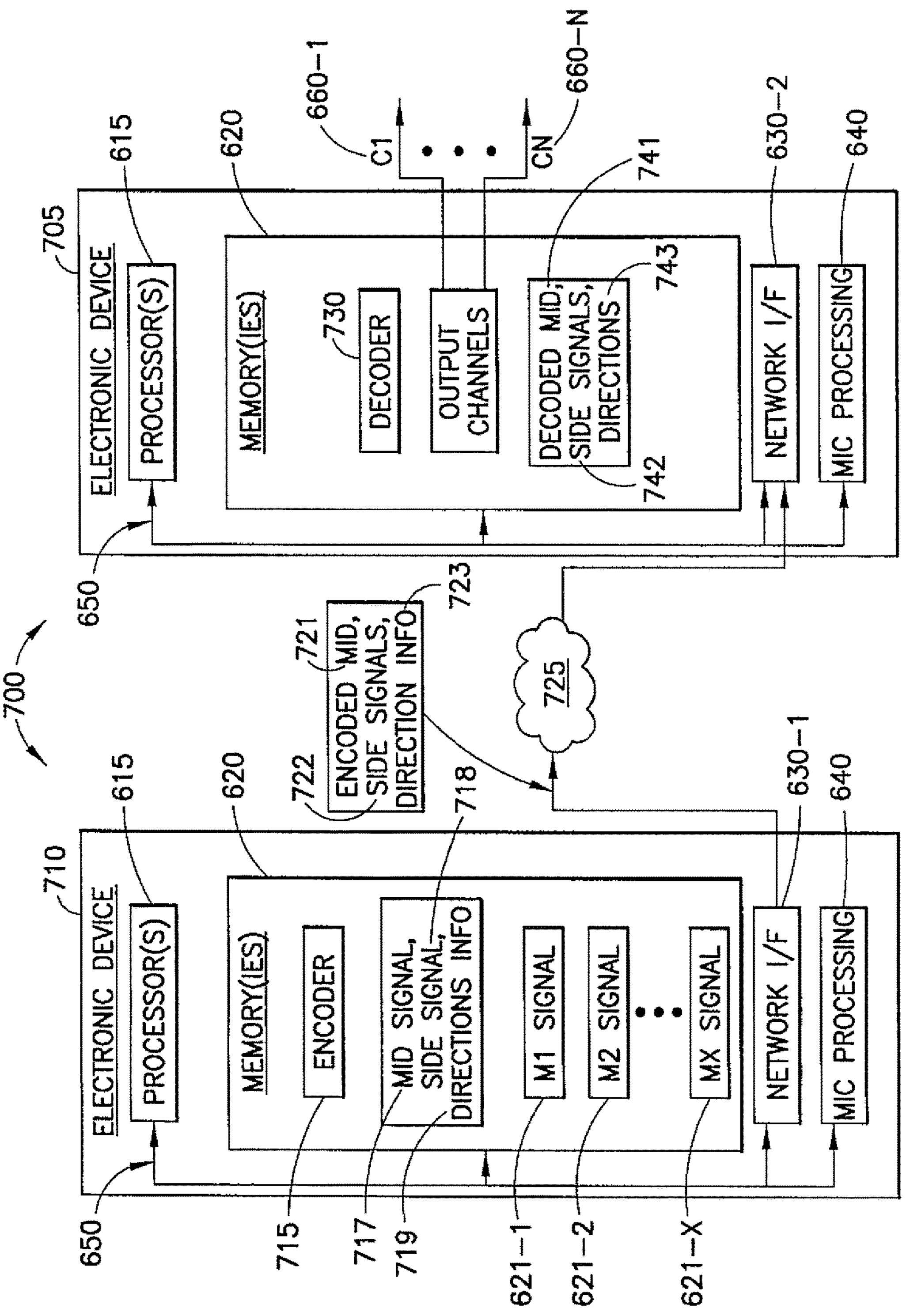
FIG. 7 is a block diagram of a second system suitable for performing embodiments of the invention for signal coding aspects of the invention.
Figure 9:
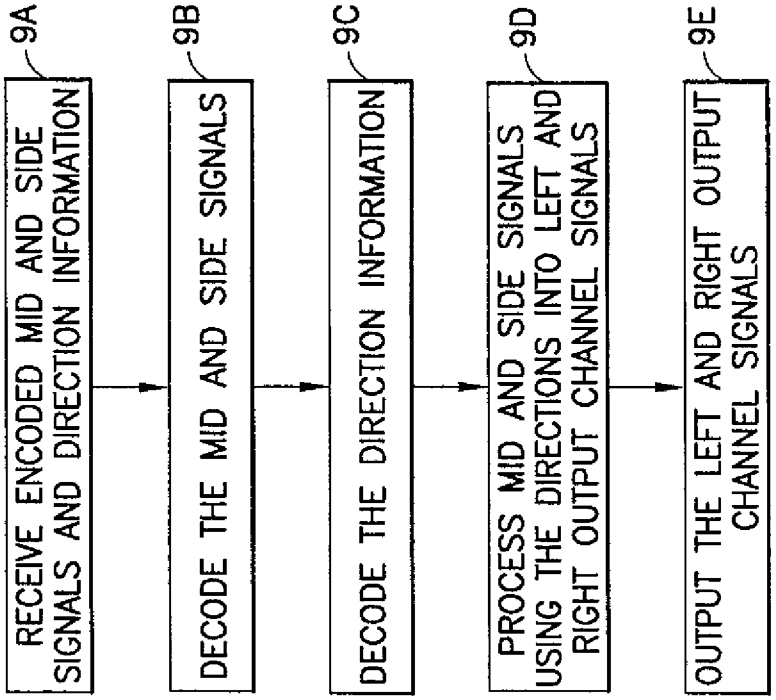
FIG. 9 is a block diagram of operations performed by the decoder from FIG. 7.
Figure 8:
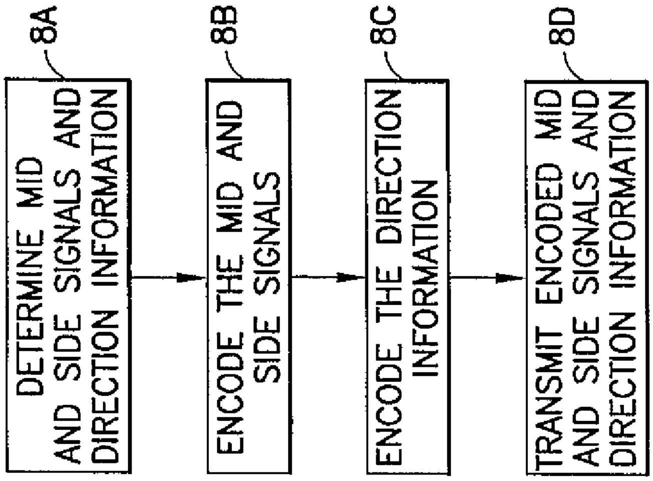
FIG. 8 is a block diagram of operations performed by the encoder from FIG. 7.

FIG. 7 illustrates a block diagram of a second system 700 suitable for performing embodiments of the invention for signal coding aspects of the invention. FIG. 8 is a block diagram of operations performed by the encoder from FIG. 7, and FIG. 9 is a block diagram of operations performed by the decoder from FIG. 7. There are two electronic devices 710, 705 that communicate using their network interfaces 630-1, 630-2, respectively, via a wired or wireless network 725. The encoder 715 performs operations on the frequency-domain microphone signals 621 to create at least the mid signal 717 (see equation (13)). Additionally, the encoder 715 may also create the side signal 718 (see equation (14) above), along with the directions 719 (see equation (12) above) via, e.g., the equations (1)-(14) described above (block 8A of FIG. 8).

The encoder 715 also encodes these as encoded mid signal 721, encoded side signal 722, and encoded direction information 723 for coupling via the network 725 to the electronic device 705. The mid signal 717 and side signal 718 can be coded independently using commonly used audio codecs (coder/decoders) to create the encoded mid signal 721 and the encoded side signal 722, respectively. Suitable commonly used audio codes are for example AMR-WB+, MP3, AAC and AAC+. This occurs in block 8B. For coding the directions 719 (i.e., $\alpha_b$ from equation (12)) (block 8C), as an example, assume a typical codec structure with 20 ms (millisecond) frames (50 frames per second) and 20 subbands per frame (B=20). Every $\alpha_b$ can be quantized for example with five bits, providing resolution of 11.25 degrees for the arriving sound direction, which is enough for most applications. In this case, the overall bit rate for the coded directions would be 50*20*5=5.00 kbps (kilobits per second) as encoded direction information 723. Using more advanced coding techniques (lower resolution is needed for directional information at higher frequencies; there is typically correlation between estimated sound directions in different subbands which can be utilized in coding, etc.), this rate could probably be dropped, for example, to 3 kbps. The network interface 630-1 then transmits the encoded mid signal 721, the encoded side signal 722, and the encoded direction information 723 in block 8D.

The decoder 730 in the electronic device 705 receives (block 9A) the encoded mid signal 721, the encoded side signal 722, and the encoded direction information 723, e.g., via the network interface 630-2. The decoder 730 then decodes (block 9B) the encoded mid signal 721 and the encoded side signal 722 to create the decoded mid signal 741 and the decoded side signal 742. In block 9C, the decoder uses the encoded direction information 719 to create the decoded directions 743. The decoder 730 then performs equations (15) to (21) above (block 9D) using the decoded mid signal 741, the decoded side signal 742, and the decoded directions 743 to determine the output channel signals 660-1 through 660-N. These output channels 660 are then output in block 9E, e.g., to an internal or external N-channel DAC.

In the exemplary embodiment of FIG. 7, the encoder 715/decoder 730 contains computer program code that, when executed by the processors 615, causes the electronic device 710/705 to carry out one or more of the operations described herein. In another exemplary embodiment, the encoder/decoder or a portion thereof is implemented in hardware (e.g., a semiconductor circuit) that is defined to perform one or more of the operations described above.

Alternative Implementations

Above, an exemplary implementation was described. However, there are numerous alternative implementations which can be used as well. Just to mention few of them:

1) Numerous different microphone setups can be used. The algorithms have to be adjusted accordingly. The basic algorithm has been designed for three microphones, but more microphones can be used, for example to make sure that the estimated sound source directions are correct.

2) The algorithm is not especially complex, but if desired it is possible to submit three (or more) signals first to a separate computation unit which then performs the actual processing.

3) It is possible to make the recordings and the actual processing in different locations. For instance, three independent devices, each with one microphone can be used, which then transmit the signal to a separate processing unit (e.g., server) which then performs the actual conversion to binaural signal.

4) It is possible to create binaural signal using only directional information, i.e. side signal is not used at all. Considering solutions in which the binaural signal is coded, this provides lower total bit rate as only one channel needs to be coded.

5) HRTFs can be normalized beforehand such that normalization (equation (19)) does not have to be repeated after every HRTF filtering.

6) The left and right signals can be created already in frequency domain before inverse DFT. In this case the possible decorrelation filtering is performed directly for left and right signals, and not for the side signal.

Furthermore, in addition to the embodiments mentioned above, the embodiments of the invention may be used also for:

1) Gaming applications;

2) Augmented reality solutions;

3) Sound scene modification: amplification or removal of sound sources from certain directions, background noise removal/amplification, and the like.

However, these may require further modification of the algorithm such that the original spatial sound is modified. Adding those features to the above proposal is however relatively straightforward.

It should be noted that the embodiments herein may be implemented as computer program products or computer programs. For instance, a computer program product is disclosed comprising a computer-readable (e.g., memory) medium bearing computer program code embodied therein for use with a computer, the computer program code comprising: for each of a number of subbands of a frequency range and for at least first and second frequency-domain signals that are frequency-domain representations of corresponding first and second audio signals: code for determining a time delay of the first frequency-domain signal that removes a time difference between the first and second frequency-domain signals in the subband. The computer program product also includes code for forming a first resultant signal including, for each of the number of subbands, a sum of one of the first or second frequency-domain signals shifted by the time delay and of the other of the first or second frequency-domain signals; and code for forming a second resultant signal including, for each of the number of subbands, a difference between the shifted one of the first or second frequency-domain signals and the other of the first or second frequency-domain signals.

As another example, a computer program is disclosed, comprising: for each of a number of subbands of a frequency range and for at least first and second frequency-domain signals that are frequency-domain representations of corresponding first and second audio signals: code for determining a time delay of the first frequency-domain signal that removes a time difference between the first and second frequency-domain signals in the subband; code for forming a first resultant signal including, for each of the number of subbands, a sum of one of the first or second frequency-domain signals shifted by the time delay and of the other of the first or second frequency-domain signals; and code for forming a second resultant signal including, for each of the number of subbands, a difference between the shifted one of the first or second frequency-domain signals and the other of the first or second frequency-domain signals, when the computer program is run on a processor. The computer program according to this paragraph, wherein the computer program is a computer program product comprising a computer-readable medium bearing computer program code embodied therein for use with a computer.

As an additional example, a computer program product is disclosed comprising a computer-readable (e.g., memory) medium bearing computer program code embodied therein for use with a computer, the computer program code comprising: code for accessing a first resultant signal comprising, for each of a plurality of subbands of a frequency range, a sum of one of a first or second frequency-domain signal shifted by a time delay and of the other of the first or second frequency-domain signals, wherein the first and second frequency-domain signals are frequency-domain representations of corresponding first and second audio signals from first and second of three or more microphones, and the time delay is a time delay of the first frequency-domain signal that removes a time difference between the first and second frequency-domain signals in a corresponding subband; code for accessing a second resultant signal comprising, for each of the plurality of subbands, a difference between the shifted one of the first or second frequency-domain signals and the other of the first or second frequency-domain signals; code for accessing information corresponding to, for each of the plurality of subbands, a direction of a sound source relative to the three or more microphones; code for determining left and right output channel signals using the first and second resultant signals and the information corresponding to the directions; and code for outputting the left and right output channel signals.

As a further example, a computer program is disclosed, comprising: code for accessing a first resultant signal comprising, for each of a plurality of subbands of a frequency range, a sum of one of a first or second frequency-domain signal shifted by a time delay and of the other of the first or second frequency-domain signals, wherein the first and second frequency-domain signals are frequency-domain representations of corresponding first and second audio signals from first and second of three or more microphones, and the time delay is a time delay of the first frequency-domain signal that removes a time difference between the first and second frequency-domain signals in a corresponding subband; code for accessing a second resultant signal comprising, for each of the plurality of subbands, a difference between the shifted one of the first or second frequency-domain signals and the other of the first or second frequency-domain signals; code for accessing information corresponding to, for each of the plurality of subbands, a direction of a sound source relative to the three or more microphones; code for determining left and right output channel signals using the first and second resultant signals and the information corresponding to the directions; and code for outputting the left and right output channel signals, when the computer program is run on a processor. The computer program according to this paragraph, wherein the computer program is a computer program product comprising a computer-readable medium bearing computer program code embodied therein for use with a computer.

In yet additional embodiments, means for performing the various operations previously described may be used. For instance, an apparatus is disclosed that comprises: means, responsive to each of a plurality of subbands of a frequency range and for at least first and second frequency-domain signals that are frequency-domain representations of corresponding first and second audio signals, for determining a time delay of the first frequency-domain signal that removes a time difference between the first and second frequency-domain signals in the subband; means for forming a first resultant signal comprising, for each of the plurality of subbands, a sum of one of the first or second frequency-domain signals shifted by the time delay and of the other of the first or second frequency-domain signals; and means for forming a second resultant signal comprising, for each of the plurality of subbands, a difference between the shifted one of the first or second frequency-domain signals and the other of the first or second frequency-domain signals.

As an additional example, an apparatus comprises means for accessing a first resultant signal comprising, for each of a plurality of subbands of a frequency range, a sum of one of a first or second frequency-domain signal shifted by a time delay and of the other of the first or second frequency-domain signals, wherein the first and second frequency-domain signals are frequency-domain representations of corresponding first and second audio signals from first and second of three or more microphones, and the time delay is a time delay of the first frequency-domain signal that removes a time difference between the first and second frequency-domain signals in a corresponding subband; means for accessing a second resultant signal comprising, for each of the plurality of subbands, a difference between the shifted one of the first or second frequency-domain signals and the other of the first or second frequency-domain signals; means for accessing information corresponding to, for each of the plurality of subbands, a direction of a sound source relative to the three or more microphones; means for determining left and right output channel signals using the first and second resultant signals and the information corresponding to the directions; and means for outputting the left and right output channel signals.

Without in any way limiting the scope, interpretation, or application of the claims appearing below, a technical effect of one or more of the example embodiments disclosed herein is to shift frequency-domain representations of microphone signals relative to each other in a number of subbands of a frequency range to determine a resultant sum signal. Another technical effect is to use the resultant sum signal as a mid signal and to determine a side signal from the sum signal. Yet another technical effect is process the mid and sum signals via binaural processing to provide a coherent downmix or output signals.

Embodiments of the present invention may be implemented in software, hardware, application logic or a combination of software, hardware and application logic. In an exemplary embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with examples of computers described and depicted. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A method comprising:

estimating directional information based on multiple input channel signals representing at least one arriving sound from a sound source captured with respective multiple microphones that have respective known locations relative to each other, wherein the multiple input channel signals include at least a first input channel signal and a second input channel signal and said estimating comprises finding a time delay so as to remove a time difference between said first input channel signal and second input channel signal;

deriving a mid-signal and a side signal on a basis of said first input channel signal, said second input channel signal and said estimated directional information, wherein said deriving further includes deriving the mid-signal as a mid-signal combination based on at least the first input channel signal and the second input channel signal, and deriving the side signal as a side signal combination based on at least the first input channel signal and the second input channel signal, wherein at least one of the mid-signal combination and the side signal combination minimizes a distortion of the at least one arriving sound caused with the at least one arriving sound arriving at different times to at least two or more of the multiple microphones; and generating an output signal comprising a plurality of output channels using said mid-signal, said side signal and said estimated directional information such that the output signal retains a spatial representation of the at least one arriving sound.

2. The method as claimed in claim 1, wherein the mid-signal combination includes one of the first input channel signal or the second input channel signal shifted with the time delay.

3. The method as claimed in claim 1, where the side signal combination includes one of the first input channel signal or the second input channel signal shifted with the time delay.

4. The method as claimed in claim 1, wherein at least one of the mid-signal combination and the side signal combination is a linear combination.

5. A method comprising:

capturing first, second and third audio signals from respective first, second and third microphones of at least three microphones spaced apart at predetermined distances and arranged in a predetermined geometric configuration;

forming a first resultant signal based on the first and second audio signals;

forming a second resultant signal based on the first and second audio signals;

determining, using at least said first and second audio signals in view of the predetermined geometric configuration, a potential direction of a sound source relative to the at least three microphones;

determining an angle of arriving sound relative to the first and second microphones, the angle having two possible values;

using a best correlation, selecting one of the two possible values of the angle as a direction of the sound source relative to the at least three microphones using the third microphone;

determining left and right output channel signals using the first and second resultant signals and information corresponding to the direction; and outputting the left and right output channel signals.

6. The method as claimed in claim 5, further comprising:

determining a time delay between at least the first and second audio signals.

7. The method as claimed in claim 6, wherein forming the first resultant signal further comprises:

forming the first resultant signal comprising a sum signal of one of the first or second audio signals shifted with the time delay and the other one of the first or second audio signals.

8. The method as claimed in claim 7, wherein forming the second resultant signal further comprises:

forming the second resultant signal comprising a difference signal between the shifted one of the first or second audio signals and the other one of the first or second audio signals.

9. The method as claimed in claim 8, further comprising:

delaying the sum signal dependent on the two possible values to create two shifted sum audio signals, and determining which of the two shifted sum audio signals has a best correlation with the third audio signal.

10. An apparatus, comprising:

one or more processors, and one or more non-transitory memories including computer program code, the one or more non-transitory memories and the computer program code configured, with the one or more processors, to cause the apparatus to perform at least the following:

estimate directional information based on multiple input channel signals representing at least one arriving sound from a sound source captured with respective multiple microphones that have respective known locations relative to each other, wherein the multiple input channel signals include at least a first input channel signal and a second input channel signal and estimating comprises finding a time delay so as to remove a time difference between said first input channel signal and second input channel signal;

derive a mid-signal and a side signal on a basis of said first input channel signal, said second input channel signal and said estimated directional information, wherein deriving further includes deriving the mid-signal as a mid-signal combination based on at least the first input channel signal and the second input channel signal, and deriving the side signal as a side signal combination based on at least the first input channel signal and the second input channel signal, wherein at least one of the mid-signal combination and the side signal combination minimizes a distortion of the at least one arriving sound caused with the at least one arriving sound arriving at different times to at least two or more of the multiple microphones; and generate an output signal comprising a plurality of output channels using said mid-signal, said side signal and said estimated directional information such that the output signal retains a spatial representation of the at least one arriving sound.

11. A computer program product embodied in a non-transitory computer memory and comprising instructions the execution of which with a processor results in performing operations that comprise:

estimating directional information based on multiple input channel signals representing at least one arriving sound from a sound source captured with respective multiple microphones that have respective known locations relative to each other, wherein the multiple input channel signals include at least a first input channel signal and a second input channel signal and said estimating comprises finding a time delay so as to remove a time difference between said first input channel signal and second input channel signal;

deriving a mid-signal and a side signal on a basis of said first input channel signal, said second input channel signal and said estimated directional information, wherein said deriving further includes deriving the mid-signal as a mid-signal combination based on at least the first input channel signal and the second input channel signal, and deriving the side signal as a side signal combination based on at least the first input channel signal and the second input channel signal, wherein at least one of the mid-signal combination and the side signal combination minimizes a distortion of the at least one arriving sound caused with the at least one arriving sound arriving at different times to at least two or more of the multiple microphones; and generating an output signal comprising a plurality of output channels using said mid-signal, said side signal and said estimated directional information such that the output signal retains a spatial representation of the at least one arriving sound.

12. A method comprising:

receiving a first audio signal from a first microphone, a second audio signal from a second microphone, and a third audio signal from a third microphone, where locations of each of the first microphone, the second microphone, and the third microphone are known, and where each of the first audio signal, the second audio signal, and the third audio signal comprises sound arriving from a sound source;

determining a first potential direction of the sound arriving from the sound source based on analysis of the first audio signal and the second audio signal;

determining a second potential direction of the sound arriving from the sound source based on analysis of the first audio signal and the second audio signal;

determining a combined audio signal, where the combined audio signal comprises the first audio signal and a shifted version of the second audio signal;

determining one of the first potential direction or the second potential direction as a direction of the sound arriving from the sound source based on the third audio signal; and generating one or more output signals based, at least partially, on the direction of the sound arriving from the sound source and the combined audio signal.

13. The method as claimed in claim 12, where the determining of the combined audio signal further comprises:

determining a delay that maximizes correlation between the first audio signal and the second audio signal; and determining the shifted version of the second audio signal, where the determining of the shifted version of the second audio signal comprises shifting the second audio signal with the determined delay.

14. The method as claimed in claim 12, where the determining of the one of the first potential direction or the second potential direction as the direction further comprises:

determining a first distance between the third microphone and a first sound source located in the first potential direction;

determining a first delay based on the first distance;

determining a second distance between the third microphone and a second sound source located in the second potential direction;

determining a second delay based on the second distance;

determining a delay that provides better correlation between the third audio signal and the combined audio signal, where the delay comprises one of the first delay or the second delay; and determining the one of the first potential direction or the second potential direction as the direction based, at least partially, on the delay.

15. The method as claimed in claim 12, where the generating of the one or more output signals is further based, at least partially, on a side signal, where the side signal is determined based on a difference between the first audio signal and the shifted version of the second audio signal.

16. The method as claimed in claim 15, where the generating of the one or more output signals further comprises:

processing the combined audio signal, where the processing of the combined audio signal comprises applying head related transfer functions to subbands of the combined audio signal; and processing the side signal, where the processing of the side signal comprises applying a fixed delay to subbands of the side signal.

17. The method as claimed in claim 16, further comprising:

determining one or more left output channel signals and one or more right output channel signals, where the determining of the one or more left output channel signals and the one or more right output channel signals comprises combining the processed combined audio signal and the processed side signal, and where the one or more output signals comprise the one or more determined left output channel signals and the one or more determined right output channel signals.

* * * * *